United States Patent [19]

Li

[11] Patent Number: 5,477,735
[45] Date of Patent: Dec. 26, 1995

[54] TWO-WIRE CONSTANT CURRENT POWERED TRANSDUCER

[75] Inventor: Don Li, Houston, Tex.

[73] Assignee: Bently Nevada Corporation, Minden, Nev.

[21] Appl. No.: 105,873

[22] Filed: Aug. 11, 1993

[51] Int. Cl.⁶ .............................. G01H 11/06; H03F 3/45; H03F 3/04
[52] U.S. Cl. ............................... 73/654; 73/593; 73/660; 330/261; 327/336
[58] Field of Search ............................ 73/661, 658, 660, 73/579, 587, 649, 593, 654; 330/261, 296, 297, 264, 107, 109; 327/336, 561, 562, 563, 50, 77, 78, 89

[56] References Cited

U.S. PATENT DOCUMENTS

| | | | |
|---|---|---|---|
| 3,860,481 | 1/1975 | Gopal et al. | 176/19 R |
| 4,328,441 | 5/1982 | Kroeger, Jr. et al. | 310/319 |
| 4,479,093 | 10/1984 | Mattisson | 330/258 |
| 4,612,620 | 9/1986 | Davis et al. | 364/551 |
| 4,843,344 | 6/1989 | Cox | 330/264 |
| 4,885,707 | 12/1989 | Nichol et al. | 364/551.01 |
| 4,994,693 | 2/1991 | Popescu | 307/520 |

Primary Examiner—Hezron E. Williams
Assistant Examiner—Rose M. Finley
Attorney, Agent, or Firm—Bernhard Kreten

[57] ABSTRACT

A two-wire constant current powered transducer (10) for detecting, integrating and transmitting an acceleration signal (50) received from a piezoelectric crystal (12). The crystal is operatively coupled to rotating machinery (M) such that rotating anomalies correlative of wear or potential failure can be detected early enough for preventative maintenance. The transducer (10) includes two stages (30, 40). The first stage (30) is an integrator which integrates the acceleration to velocity. The second stage (40) is a gain stage. The gain stage operates with a PNP transistor emitter follower to control the output DC bias level and route the integrated acceleration signal back to the control system.

17 Claims, 2 Drawing Sheets

TWO-WIRE CONSTANT CURRENT POWERED TRANSDUCER

FIELD OF THE INVENTION

This invention relates to a two-wire piezoelectric crystal velocity transducer that is designed to process a cyclic voltage acceleration signal and to output an integrated velocity response. More specifically this invention relates in general to monitoring a bearing housing or casing for structural vibration related to rotating and reciprocating machinery by the use of transducers in order to diagnose the overall condition of the machine which is correlative to maintenance.

BACKGROUND OF THE INVENTION

Two-wire constant current powered transducers are presently using individual Field-Effect transistors (FETs) and Bipolar Junction transistors (BJTs) to process data. These circuits are heavily dependent on the characteristics of the active components, which usually have a wide range of component tolerance, such as gain, bias voltage, bias current and temperature coefficient.

Accordingly, each production unit has to be initially calibrated to incorporate those tolerances. Moreover, the optimal operating point drifts widely as a function of both temperature and age. The bandwidth is narrow (because of not having enough gain). The design is thus difficult and the labor and parts cost are high.

The following prior art reflects the state of the art of which applicant is aware and is included herewith to discharge applicant's acknowledged duty to disclose relevant prior art. It is stipulated, however, that none of these references teach singly nor render obvious when considered in any conceivable combination the nexus of the instant invention as disclosed in greater detail hereinafter and as particularly claimed.

| INVENTOR | ISSUE DATE | U.S. PAT. NO. |
|---|---|---|
| Bruckenstein et al. | November 4, 1975 | 3,918,005 |
| Barr | December 11, 1979 | 4,178,525 |
| Peters | March 1, 1988 | 4,727,752 |
| Park et al. | February 28, 1989 | 4,807,482 |
| Alexander | March 17, 1992 | 5,097,223 |
| Verheyen et al. | July 14, 1992 | 5,130,598 |

U.S. Pat. No. 3,918,005 to Bruckenstein, et al. teaches the use of op-amp circuitry with automatic self-biasing wherein either a controlled current or voltage is provided at the load impedance Z connected across the inverting input and the second op-amp A2.

U.S. Pat. No. 4,178,525 to Barr teaches the use of a two-wire piezoelectric acceleration transmitter for detecting and transmitting peak amplitudes of cyclic voltage developed by transducer 32 responsive to vibration.

U.S. Pat. No. 4,727,752 to Peters discloses an oscillator drive system for a piezoelectric crystal 20 whose output corresponds to a nearly sinusoidal resonator 12 signal and is illustrated as being used in an accelerometer. Peters discloses the application of driving the crystal with a digital signal where the oscillator is shown FIG. 4. Alternative embodiments are disclosed.

U.S. Pat. No. 4,807,482 to Park et al. discloses a method for measuring stimuli applied to a piezoelectric transmitter. Two embodiments are disclosed.

U.S. Pat. No. 5,097,223 to Alexander teaches the use of a current feedback audio power amplifier utilizing a pair of op-amps A1 and A2 wherein A1 is a buffer amplifier used for audio gain and A2 is used for sub-audio gain. The output of A1 is connected in a voltage gain feedback circuit back to its inverting input and a voltage gain feedback loop is connected across A2. A current limiting circuit can be provided if desired to limit the current in the output stage.

U.S. Pat. No. 5,130,598 to Verheyen et al. discloses apparatus for driving a piezoelectric actuator for a fuel injector.

OTHER PRIOR ART

Industrial Monitoring Instrumentation a division of PCB Piezotronics Inc.; Machinery Vibration Measurement & Monitoring Instrumentation; 1992.

Endevco Corporation; Isotron Accelerometer; 1992.

Columbia Research Labs, Inc. a Piezoelectric Products Division; 1985.

Imo Industries Inc., CEC Instruments Division, Pressure and motion transducers for high performance industrial and mil/aerospace applications, Short form catalog Kistler Instrument Corp., Measure Acceleration, Shock and Vibration.

Metrix Instrument Co., 1991/1992 Catalog. Pages 6–9,14–23.

PCB Piezotronics Inc. Low impedance quartz accelerometers series 300.

SKF, Condition Monitoring Catalog, 1991, pages B-38 to B-45.

Vibra•Metrics, Accelerometer Selector guide, Sep. 1, 1989 bulletin VM142.

Vibro-Meter Corp., 400 Series Charge-Coupled Accelerometers, pages 2–1–7.

Wilcoxon Research, Industrial Vibration Sensors.

Wilcoxon Research, Short form Catalog of Vibration Instrumentation, March 1991, pages 1–12.

The other prior art listed above, but not specifically discussed, further chronicle the prior art of which the applicant is aware.

SUMMARY OF THE INVENTION

The present invention comprises a two-wire transducer for measuring machine vibration. This vibration is received by an sensor which includes a piezoelectric crystal for transforming the received acceleration signal into a signal whose frequency is equal to the frequency of vibration and whose amplitude is proportional to the acceleration of vibration. The transformed signal is received by and integrated into a velocity signal by a first stage of a two stage circuit contained in a constant current powered signal conditioning circuit.

The sensor, in combination with the first stage, operate at a bias above circuit ground. This elevated bias is the result of a constant current source biasing a zener diode to provide a constant reference voltage.

The second stage comprises a second op-amp configured as a high gain amplifier with a means for calibration of the overall sensitivity of the transducer. The output of the second op-amp is directly coupled to a base of a PNP transistor which is configured as an emitter follower and functions as a signal output driver and a current compensator.

The velocity signal output of the first stage referenced to the elevated bias is capacitively coupled, to eliminate the DC component passed by the first stage, to the second stage amplifier wherein the second stage amplifies and outputs a voltage signal in accordance with the velocity signal input.

The constant current powered signal conditioning circuit further provides a stable DC voltage biasing of the output signal, the constant current source and the power terminals of the op-amps.

OBJECTS OF THE INVENTION

A primary object is to provide a device which does not require inordinate calibration because, inter alia, a majority of the components forming the circuit are passive elements, e.g. capacitors, resistors etc.

Another further object is to provide a reliable vibration sensor.

Another further object is to provide a vibration sensor which is stable both as a function of age and temperature change.

Another further object is to provide a vibration sensor which has an output DC bias independent of "active" device parameters.

These and other objects will be made manifest when considering the following detailed specification when taken in conjunction with the appended drawing figures.

DESCRIPTION OF PREFERRED EMBODIMENTS

Figure 1:
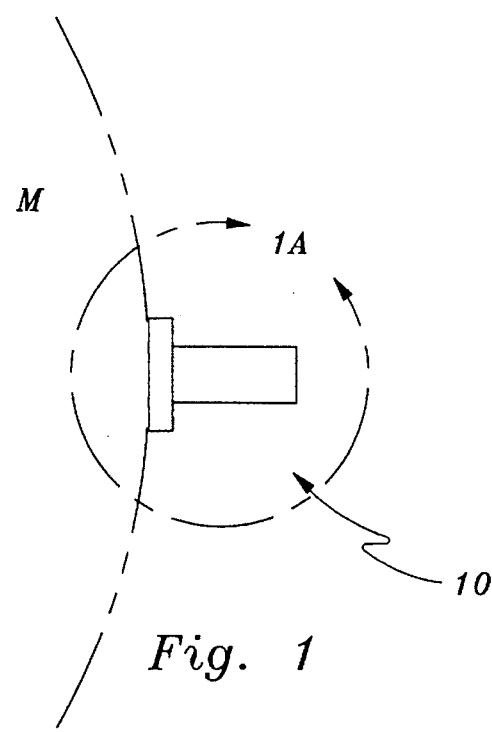
FIG. 1 is an elevational view of the transducer device of this invention in place on a machine for monitoring of the vibration thereof.

Before delineating the description of the operation of the two-wire constant current powered transducer some basic introductory material is provided to simplify the circuit description and analysis.

First, the variable and double-subscript notation that is utilized in the voltage description of an AC signal, a DC signal and the combination of the two is as follows: AC signals use lower case letters for the variable and double-subscript notation (e.g. $v_{cd}$), DC signals use upper case letters for the variable and double-subscript notation (e.g. $V_{CD}$) and the superimposed AC and DC signals use lower case letters for the variable and upper case letters for the double-subscript notation (e.g. $v_{CD}$).

Second, note that "operational amplifier" (abbreviated op-amp) refers to a direct-coupled high gain amplifier to which feedback is added to control its overall response characteristic. A typical op-amp has five basic terminals: two for supply power, two for input signals (which are labeled with a negative (−) sign and positive (+) sign), and one for the output. The input terminal marked with a negative sign is referred to as the inverting input because it produces an output signal that is inverted or 180 degrees out of phase with the input signal. The input terminal marked with a positive sign is referred to as the noninverting input because it produces an output that is not inverted or "phase preserved". As an aid in circuit analysis, the "ideal" characteristics of an op-amp are used. This is practical because the "ideal" characteristics of the op-amp closely approximate that of real op-amp characteristics. A summary of the ideal characteristics of the op-amp that are applied for simplification of circuit analysis are as follows:

1. The input impedance of the inverting and noninverting terminals is infinitely large; thus, the input current to the op-amp is zero.

2. The voltage ($v_{+-}$) between the inverting and noninverting terminals is zero. This is described by saying that the input terminals "stick" together.

3. The open loop voltage gain is infinite.

4. Output impedance is zero; consequently, output voltage is independent of load.

5. The bandwidth is infinite.

6. The op-amp characteristics do not drift with temperature.

These and other characteristics of the op-amp can be found in Micro-Electronics Digital and Analog Circuits and Systems by Jacob Millman, McGraw-Hill Book Company, 1979 at pages 523 through 525.

In conclusion of the basic introductory material it should be noted that in critical applications of low-level inputs and high gain, the power supply requirements are extremely stringent. Voltage changes or noise on the power-supply lines can be coupled into an op-amp and appear as equivalent input signals. Manufacturers take this into account in the design of op-amps by minimizing these effects. The ability of an op-amp to reject voltage changes or power-supply-induced noise and drift on the power supply lines is called the power-supply rejection ratio (PSRR). Stated another way, the (PSRR) is the ratio of the change in input offset voltage to the change in power-supply voltage producing it. Ratings may be given for each power supply separately or together, giving a typical value and a maximum limit. The unit of measure may be µV/V or decibels (dB).

Referring to the drawings, FIG. 1 shows an elevational view of the two-wire constant current powered transducer 10 coupled to a vibrating machine M for monitoring the acceleration of vibration thereof.

Figure 1A:
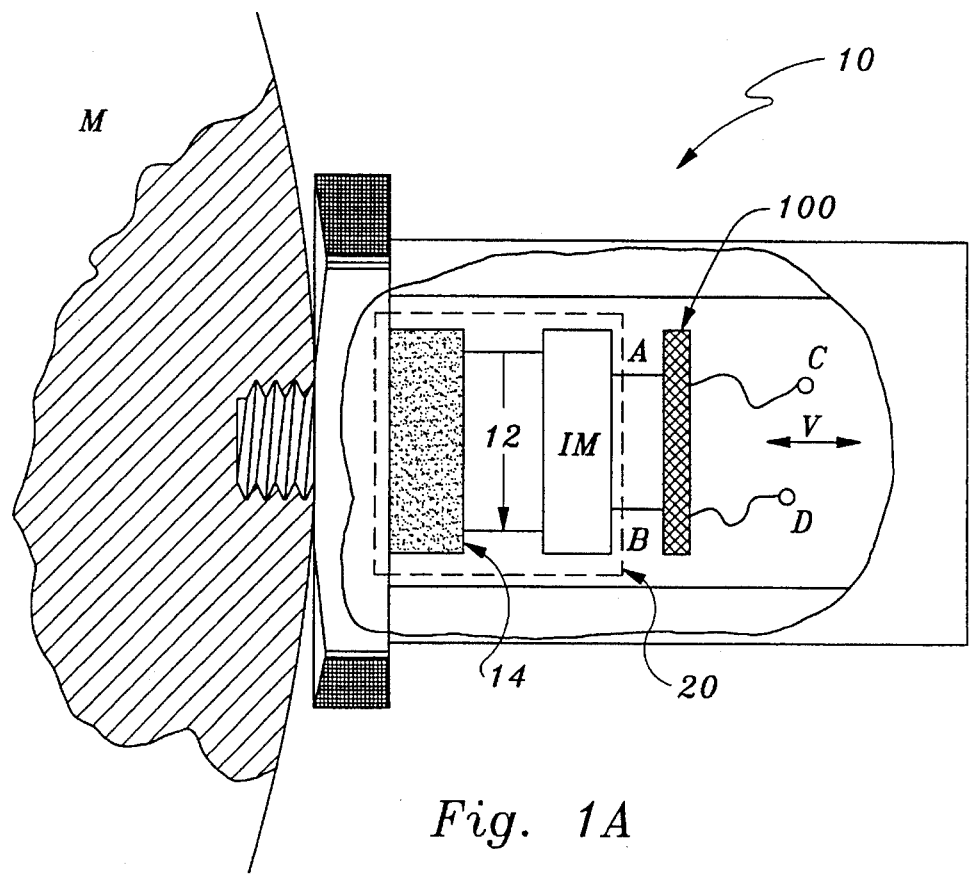
FIG. 1A is a sectional view taken along line 1A—1A of FIG. 1 with portions of the machine and the transducer cut away to reveal interior details thereof.

Referring to FIG. 1A, reveals a sectional view of the two-wire constant current powered transducer 10 for monitoring acceleration of vibration and for outputting an acceleration signal of amplitude proportional thereto. The two-wire constant current powered transducer 10 utilizes a piezoelectric crystal 12 situated between an sensor base 14 and an inertial reference mass IM as a sensor 20 of acceleration. When the two-wire constant current powered transducer 10 is coupled to the machine M, the vibration of machine M causes a compression or tension force "V" to act on the piezoelectric crystal 12. The piezoelectric crystal 12, in turn, acts as a precision spring to oppose compression or tension force thereby generating an electric charge. Thus, an output directly proportional to amplitude of acceleration is produced at terminals A and B of the sensor 20.

Figure 2:
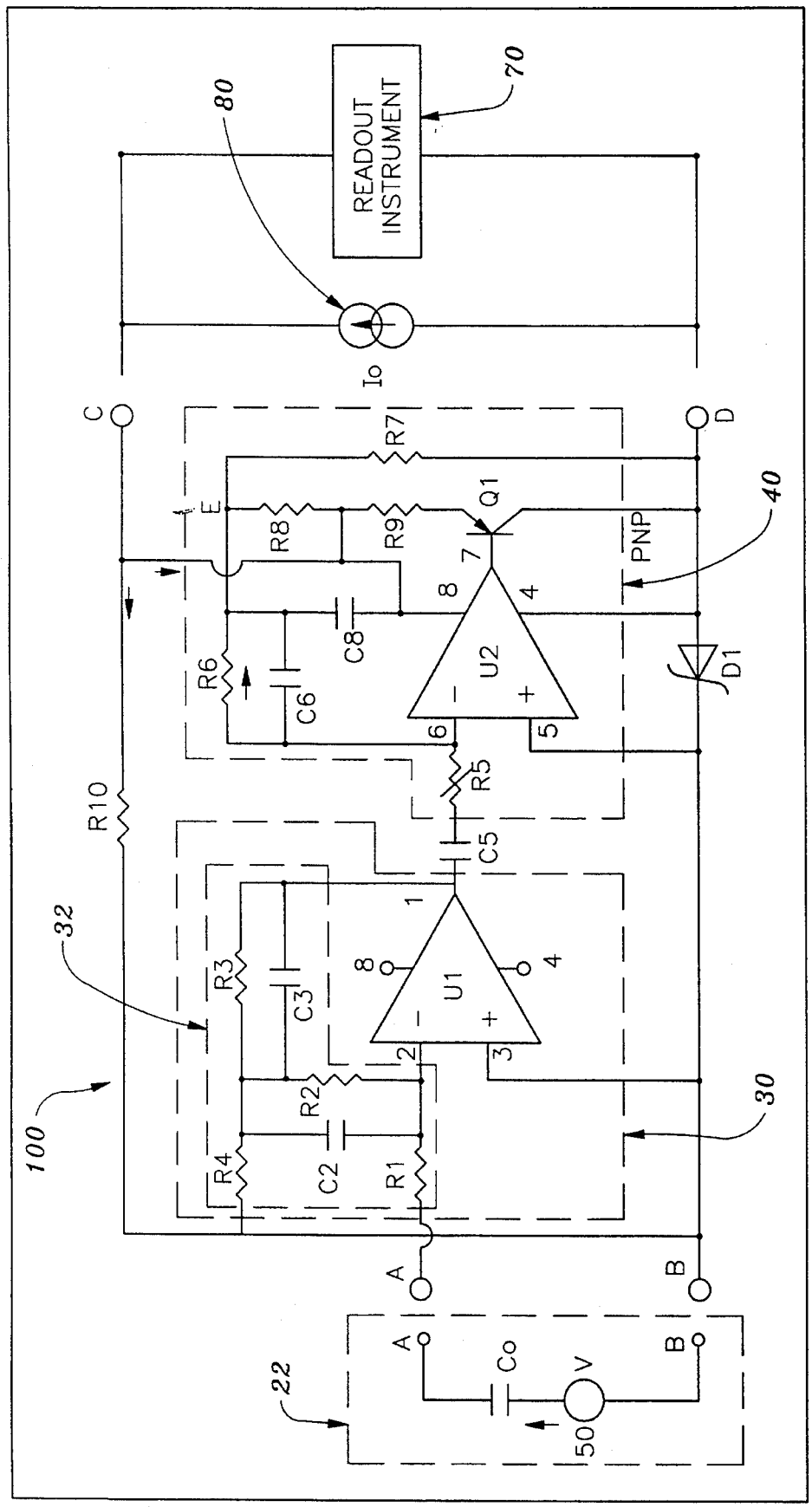
FIG. 2 is a schematic view of a circuit utilized for conditioning of a signal within the transducer.

FIG. 2 illustrates the equivalent circuit 22 of the sensor 20 (shown in FIG. 1A). The output terminals A and B of the equivalent circuit 22 are the same terminals A and B of the sensor 20 (shown in FIG. 1A). These terminals are coupled to nodes A and B of the constant current powered signal conditioning (CCPSC) circuit 100 which includes a first stage 30 and a second stage 40.

The equivalent circuit 22 can be treated as a voltage source whose input signal 50 (i.e. to the CCPSC circuit 100) has a frequency equal to the vibration frequency of the machine M and whose amplitude is proportional to the magnitude of acceleration. This voltage source is in series with an equivalent capacitor $C_O$. The capacitance is determined by the effective area of the parallel plated conductive material (usually metal) on the piezoelectric crystal 12 (FIG. 1A) and the dielectric constant of the piezoelectric crystal 12 (FIG. 1A). This equivalent circuit 22 is used in the design of the first stage 30.

The acceleration signal 50 is received by op-amp $U_1$ through the equivalent crystal capacitor $C_0$ and input resistor $R_1$. Resistor $R_1$ determines the input impedance of the constant current powered signal conditioning (CCPSC) circuit 100. This RC network ($R_1$ and $C_0$) acts as a high pass filter (typically −3 db around 10 to 20 Hz for the reference values listed below). To make a low frequency velocity transducer, this invention applies compensation.

FIG. 2 further illustrates the constant current powered signal conditioning (CCPSC) circuit 100 connected to the equivalent circuit 22 (sensor 20 of FIG. 1A) for converting the acceleration signal 50 into an output voltage signal indicative of a magnitude of vibration.

The first stage 30 of the constant current powered signal conditioning (CCPSC) circuit 100 is an active integrating amplifier (AIA) circuit 30. The AIA circuit 30 integrates the acceleration signal 50 by utilizing network (32) which includes capacitors $C_2$, $C_3$ and resistors $R_1$, $R_2$, $R_3$ and $R_4$ configured to a first op amp $U_1$. Using the resistor and capacitor network 32 allows relatively small resistor values so that the disadvantages of large value resistors can be avoided.

The first op-amp $U_1$ has a noninverting input pin 3 connected to a first terminal B of the equivalent circuit 22, an inverting input pin 2 connected to a second terminal A of the equivalent circuit 22 through a resistance $R_1$, an output at pin 1 capacitively coupled to the second stage 40 of the CCPSC circuit 100, and a feedback loop including a capacitance (capacitors $C_2$ and $C_3$) coupled between the inverting input pin 2 and the output pin 1 of the first op-amp $U_1$.

A T-network results when resistor $R_1$ is excluded from network 32. The T-network includes a top branch having two portions and a base branch. The base branch includes impedance means ($R_2$ in parallel with $C_2$) having one end coupled to the inverting input pin 2 of the first op-amp $U_1$ and another end coupled to the intersection of the two portions of the top branch. The top branch includes resistive means ($R_4$) on one portion which is connected to the noninverting input pin 3 and an impedance means ($R_3$ in parallel with $C_3$) on another portion which is connected to the output terminal pin 1 of the first op-amp $U_1$.

The frequency at which the gain of the first stage 30 has a value of one is determined by the resistor and capacitor network 32.

The first stage 30 has a gain, $Gain_1$, that varies with the vibration frequency of the machine M. A simple calculation reveals the mid-band gain-frequency response $$Gain_1(f) = (1/R_1 \cdot C_2 + 1/R_1 \cdot C_3)/(2 \cdot \pi \cdot f)$$

which can be simplified as $$Gain_1(f) = 1/(2 \cdot \pi \cdot f \cdot C_{23} \cdot R_1)$$

where $C_{23}$ is the serial capacitance of $C_2$ and $C_3$, and where f=frequency in Hertz, and where $\pi$=the constant Pi 3.14 . . .

The low frequency response of the integrated signal is determined by the equivalent piezoelectric crystal capacitance $C_0$ and the input impedance $R_1$ of the constant current powered signal conditioning (CCPSC) circuit 100.

The second stage 40 of the constant current powered signal conditioning (CCPSC) circuit 100 is capacitively coupled to the active integrating amplifier (AIA) circuit 30 (i.e. the first stage 30) for supplying a voltage output in accordance with the velocity voltage signal, whereby the output voltage is correlative of the vibration being monitored. The output of op-amp $U_2$ is directly coupled to a PNP transistor $Q_1$.

Transistor $Q_1$ is configured as a common-collector (CC) transistor amplifier. This configuration is also called an "emitter follower", because its voltage gain is close to unity, and hence a change in base voltage appears as an equal change across the load at the emitter. In other words, the emitter follows the input signal. It can be shown that the input resistance of an emitter follower is very high (on the order of hundreds of Kilohms) and the output resistance is very low (on the order of tens of ohms). Hence, the most common use for the CC transistor circuit is as a buffer stage which performs the function of resistance transformation (from high to low resistance) over a wide range of frequencies, with voltage gain close to unity. In addition, the emitter follower increases the power level of the signal.

$Q_1$ functions as a signal output driver (buffer) and a current compensator. The current $I_{Q1}$ is determined by the constant current $I_0$, the power consumption of $U_1$ and $U_2$, the current flow through the zener diode $D_1$, $I_{D1}$ and the current losses, $I_{loss}$ (through $R_8$, $R_4$ and $R_2$, $R_3$, $R_4$) which are relatively small.

$$I_{Q1} = I_{CD} - I_{D1} - I_{U1} - I_{U2} - I_{loss}$$

The impedance change of $Q_1$ multiplied by the transistor current $I_{Q1}$ is the output signal voltage $v_{cd}$ which overlaps onto the DC bias voltage $V_{CD}$. This output will be controlled by the second stage 40 which acts as a gain stage and a frequency compensator by trading off high gain of the op-amp $U_2$ for a larger bandwidth.

The change of the output voltage of op-amp $U_2$ is equal to the AC output voltage together with a very small variation due to the change in the voltage between the emitter and base of transistor $Q_1$ caused by the AC current, temperature, and the variation between different devices. This variation is compensated by the large gain of op-amp $U_2$. The total frequency response will not be influenced by the characteristics of the transistor $Q_1$. To find the mid-band gain of the second stage 40, an AC analysis of the constant current powered signal conditioning (CCPSC) circuit 100 is done. The inverting input pin 6 is "AC ground" (all the voltages are referenced to node D) The input voltage $v_{in}$ through capacitor $C_5$ and resistor $R_5$ will generate a current $I_{in}$ calculated by the equation:

$$I_{in} = v_{in}/R_5.$$

Since the input impedance of $U_2$ is extremely high, very little current flows into op-amp $U_2$ pin 6 and virtually all the input signal current will flow to node E causing a change in the voltage at node E. $v_e$ is calculated by the equation:

$$v_3 = -I_{in} \cdot R_6 = -v_{in} \cdot R_6/R_5.$$

This voltage will generate a current through resistor $R_7$ calculated by:

$$I_7 = v_e/R_7$$

The potential difference between node C and E will also generate a current through $R_8$ to node E calculated by:

$$I_8=(v_c-v_e)/R_8.$$

At node E, summing currents by the equation:

$$I_{in}+I_8=I_7$$

establishes the value of $I_7$.

From the above equations, the mid-band voltage gain of the second stage 40 is derived. It is expressed as:

$$Gain_2=v_{cd}/v_{in}=(R_7*R_8+R_6*R_7+R_6*R_8)/(R_5*R_7)$$

The total mid-band frequency response of constant current powered signal conditioning (CCPSC) circuit 100 from node A, B to C, D is the multiple of $Gain_1$ and $Gain_2$.

The above mid-band voltage gain equations of the constant current powered signal conditioning (CCPSC) circuit 100 reveals the characteristic of an output signal being independent of any active elements and dependent only on the passive components therein.

Regarding the mid-band, the output at pin 1 of the first stage 30 will have a phase shift of 90° referenced to the input, the second stage 40 will acid an additional phase shift of 180°. Therefore, the overall phase shift will be 90° which is equal to the phase difference of velocity and acceleration. The high and low end phase shift will be determined by the poles and zeros of the constant current powered signal conditioning (CCPSC) circuit 100 which can be derived using transform methods common in the art.

Together, resistor $R_6$ and the optional capacitor $C_6$ will determine the high end of the frequency response. The capacitor $C_6$ is used to compensate for stray input capacitance between the inverting input at pin 6 of op-amp $U_2$ and AC ground and also between the noninverting input at pin 5 of op-amp $U_2$ and AC ground. The capacitor $C_6$ also compensates for any differential stray capacitance between the inputs of op-amp $U_2$.

Referring to FIG. 2, the DC voltage bias analysis of the constant current powered signal conditioning (CCPSC) circuit 100 comprising of a first stage 30 and the second stage 40 will be described. The constant current source 80 is conductively coupled for providing the current in the branch consisting of a serially connected resistor $R_{10}$ and zener diode $D_1$. This constant current source 80 provides the zener diode $D_1$ with a voltage at which the zener diode begins to operate in the breakdown region which is the criteria for the zener diode $D_1$ to operate as a voltage regulator thereby providing a highly stable reference voltage that is to be maintained across the diode. This regulated DC bias voltage is received by the input signal 50, the noninverting input at pin 3 of op-amp $U_1$ and the noninverting input at pin 5 of op-amp $U_2$. This voltage is higher than the reference potential of node D (circuit ground) by an amount equal to $V_{BD}$.

The output from the first stage 30 is the output from pin 1 of op-amp $U_1$. The DC output level of the first stage 30 (pin 1 of op-amp $U_1$) referenced to node D is equal to the voltage drop across the zener diode $D_1$. The output from the first stage 30 pin 1 referenced to node B is independent of any variation of the zener diode $D_1$. This output is capacitively coupled via capacitor $C_5$ to the input of the second stage 40. This in turn is coupled via potentiometer $R_5$ to the inverting input pin 6 of op-amp $U_2$. Potentiometer $R_5$ calibrates the overall sensitivity of the transducer 10 to compensate for the sensitivity variation of the sensor 20 (shown in FIG. 1A).

The DC bias voltage applied to the noninverting input at pin 5 of op-amp $U_2$ will appear at the inverting input pin 6 of op-amp $U_2$ due to the ideal characteristics described previously. Also, the ideal characteristics indicate that the op-amp $U_2$ has no current flow into or out of the noninverting pin 5 and inverting pin 6 terminals. One result of the ideal characteristics is that the voltage regulator (zener diode $D_1$) remains unloaded (load current is not drawn from the branch containing resistor $R_{10}$ and zener diode $D_1$).

The capacitors ($C_5$, $C_6$, and $C_8$) also prevent DC current flow in their respective branches. As a result, no DC current passes through resistor $R_6$. $V_{D1}$, the DC drop across the zener diode $D_1$, and resistors $R_7$, $R_8$ alone will determine the output DC bias voltage $V_{CD}$. Since op-amp $U_2$ has high gain (which is described above) it causes transistor $Q_1$ to draw just enough current from the constant current source 80 to force output $V_{CD}$ to a voltage that will maintain the voltage across $R_7$ equal to $V_{D1}$. This must occur because the voltage across resistor $R_6$ caused by the input leakage current of op-amp $U_2$ is negligible. Resistors $R_8$ and $R_7$ form a voltage divider network for the output voltage $V_{CD}$ having a value defined by:

$$V_{CD}=V_{D1}*(R_7+R_8)/R_7.$$

This equation can also be derived by noting that the current $V_{D1}/R_7$ is flowing in resistor $R_7$ and that same current must flow through resistor $R_8$ (since no DC current passes through $R_6$ due to the ideal characteristics discussed above). Thus, a DC output voltage $V_{CD}$ can be calculated from:

$$V_{CD}=(V_{D1}/R_7)*(R_7+R_8).$$

From the above equation, it is noted that the output DC bias is independent of "active" device parameters such as the PNP transistor $Q_1$. It is only determined by the passive elements (i.e. resistors) that are fairly stable throughout the range of operation in the environment. This feature provides distinct advantages of this invention over the prior art, especially by applying op-amps.

Voltage $V_{CD}$ provides the DC bias voltage of the positive power supply terminal pin 8 and the negative supply terminal pin 4 which are shared by both op-amps $U_1$ and $U_2$. This DC voltage also provides the biasing of the constant current source 80. By using this "pre biased" technique, any noise of the first stage 30 created by ground loops and bias fluctuations of zener diode $D_1$ will be greatly reduced, greatly enhancing the transducer 10 performance.

In use and operation, and referring to FIG. 2, the constant current powered signal conditioning (CCPSC) circuit 100 consists of a single monolithic chip with dual op-amps $U_1$ and $U_2$ therein and supporting hardware to perform the function of signal processing an input acceleration voltage signal (across terminals A,B) to an output voltage signal (across terminals C,D) for utilization by a readout instrument 70 connected thereto. Power for the constant current powered signal conditioning (CCPSC) circuit 100 is provided by a constant current source 80 outputting a constant current $I_0$.

A dual conductor transmission line (i.e. coaxial cable or a simple twisted pair) is not only used to monitor the output signal but is also used to provide the signal conditioning circuit 100 with operating power. Because the power supply leads double as the signal output leads two or three extra wires are eliminated in remote signal applications.

The constant current powered signal conditioning (CCPSC) circuit 100 integrates and amplifies the signal 50 by passing the signal 50 through two stages 30, 40. The first stage 30, an active integrator amplifier (AIA) circuit, integrates the input signal 50 via op-amp $U_1$ and circuitry configured thereto and outputs a voltage velocity signal which is capacitively coupled by capacitor $C_5$ to the second stage 40, which includes a high gain op-amp $U_2$ having its output directly coupled to the base of transistor $Q_1$ wherein $Q_1$ functions as a signal output driver (buffer) and a current compensator. The output of op-amp $U_2$ causes an impedance change of transistor $Q_1$. This impedance change of $Q_1$ is multiplied by the transistor current $I_{Q1}$ to provide the output signal voltage $v_{cd}$, that corresponds to the vibration of the machine M, which overlaps onto the DC bias voltage $V_{CD}$ which is provided by the biasing technique that follows.

At the outset the constant current source 80 provides the signal conditioning circuit 100 with a constant current at an initial DC bias voltage of 24 volts. This provides the current flow in the branch containing resistor $R_{10}$ and a zener diode $D_1$. The zener diode $D_1$ is biased to function as a stable DC voltage regulator providing a stable DC reference voltage above circuit ground to the input signal 50, the noninverting input (pin 3) of op-amp $U_1$ and the noninverting input (pin 5) of op-amp $U_2$.

The ideal characteristics of op-amp $U_2$ provides the following effect: first, the DC regulated voltage that is provided at the noninverting input (pin 5) of op-amp $U_2$ will appear at the inverting input (pin 6) of op-amp $U_2$ and second, op-amp $U_2$ has no current flow into or out of the op-amp at both the noninverting (pin 5) and inverting (pin 6) terminals.

The capacitors $C_5$, $C_6$, and $C_8$ also prevent DC current flow in their respective branches. As a result, no DC current passes through resistor $R_6$ and the voltage appearing at the inverting input pin 6 and the first end of resistor $R_6$ will appear at the second end of resistor $R_6$ without a voltage drop occurring across resistor $R_6$ thereby providing a regulated voltage across $R_7$. The current through $R_7$ is provided by the constant current source 80 and not by the voltage regulator $D_1$ itself thereby providing an unloaded voltage source across $R_7$.

The resistor $R_7$ is contained in a branch of two serially connected resistors, $R_7$ and $R_8$. This branch has a first end coupled to a first terminal C of the constant current source 80 and a second end coupled to the second terminal D (circuit ground) of the constant current source 80. The regulated voltage that is applied across resistor $R_7$ draws a constant current, from the constant current source 80, through said serially connected resistors, $R_7$ and $R_8$, and due to the high gain of op-amp $U_2$ the transistor $Q_1$ will provide a means to compensate for the remaining current that is provided by the constant current source 80. This unique biasing technique reduces the initial DC biasing voltage $V_{CD}$ from 24 volts to 12 volts.

Therefore, the signal conditioning circuit 100 has the ability to provide its own stable DC bias voltage in which active components and their fluctuations are eliminated. This stable DC bias voltage $V_{CD}$ is used for the biasing of the constant current source 80, the output signal and the power supply terminals pin 4 and pin 8 which are shared by both op-amps $U_1$ and $U_2$. This biasing technique is stable over a temperature range of −55° C. to +125° C. and for the life of the device.

The ability of an op-amp to reject signals on the power-supply line from interfering with the operating characteristics of the op-amp is referred to as the power-supply rejection ratio (PSRR). This characteristic allows the output signal to ride on top of the power supply signal without effecting the operating characteristics of the circuit.

Using the preferred components of the table below results in the conditioning circuit 100 having a 3 db frequency response from approximately 2 Hz to 5 KHz over the stable bias temperature range of −55° C. to +125° C.

Finally, it is noted that a very low AC impedance and a low temperature coefficient are required to maintain the stability of the circuit and frequency response. Judicious selection of op-amp $U_1$ is important to the performance of the transducer circuitry 100, because it will affect the noise, integration and large signal handling capacity of the circuit 100. In other words, op-amp $U_1$ should match the ideal characteristics as closely as possible.

Moreover, having thus described the invention, it should be apparent that numerous structural modifications and adaptations may be resorted to without departing from the scope and fair meaning of the instant invention as set forth hereinabove and as described hereinbelow by the claims.

The following table summarizes the values of the components employed in a preferred embodiment of the invention:

| Element No. | Description | Value of Designation |
| --- | --- | --- |
| R1 | Resistor | 20MΩ |
| R2 | Resistor | 10MΩ |
| R3 | Resistor | 10MΩ |
| R4 | Resistor | 750KΩ |
| R5 | Resistor | 1.3MΩ |
| R6 | Resistor | 20MΩ |
| R7 | Resistor | 10MΩ |
| R8 | Resistor | 20MΩ |
| R9 | Resistor | 1KΩ |
| R10 | Resistor | 20KΩ |
| C2 | Capacitor | 0.01 μF |
| C3 | Capacitor | 0.01 μF |
| C5 | Capacitor | 0.1 μF |
| C6 | Capacitor | 2 PF |
| C8 | Capacitor | 0.01 μF |
| U1 and U2 | Operational Amplifier | TL032 |
| D1 | Zener Diode | 4 V |
| C0 | Piezo Crystal Capacitor | 800 PF |
| Q1 | Transistor | PNP |
| I0 | Current Source | 3 mA (typical) |

I claim:

1. A circuit for processing a vibration signal in a vibration monitoring device comprising in combination:

a constant current source providing power;

power supply lines operatively coupled to said constant current source;

a transistor operatively coupled to said power supply lines;

a high gain op-amp having an inverting input terminal, a noninverting input terminal, an output terminal and power supply terminals;

said output terminal of said high gain op-amp operatively coupled to said transistor;

a voltage signal into one of said input terminals of said high gain op-amp;

whereby an output from said output terminal of said high gain op-amp causes an impedance change of said transistor wherein said impedance change along with an amount of said constant current through said transistor provide an output signal voltage to said power supply lines wherein said output signal voltage corresponds to the vibration signal of a machine being monitored.

2. The circuit of claim 1 wherein said input voltage signal is a voltage velocity signal and said one of said input terminals is said inverting input terminal of said high gain op-amp.

3. The circuit of claim 2, further including a sensor operatively coupled to the machine and generating an electric charge from the vibration of the machine.

4. The circuit of claim 3, wherein said sensor includes:
   a piezoelectric crystal situated between a sensor base and an inertial reference mass;
   wherein the vibration of the machine causes a compression or tension force to act on said piezoelectric crystal and said piezoelectric crystal acts as a precision spring to oppose compression or tension forces thereby generating an electric charge and an acceleration signal having a frequency equal to the vibration frequency of the machine and an amplitude proportional to the magnitude of acceleration of the vibration.

5. The circuit of claim 4, further including means, for providing a constant DC voltage to said power supply lines.

6. The circuit of claim 5 wherein said means for providing a constant DC voltage to said power supply lines includes a first zener diode operatively coupled to said power supply lines.

7. The circuit of claim 6 wherein said means for providing a constant DC voltage to said power supply lines further includes:
   a first branch including a first resistor connected in series with said zener diode;
   said first branch operatively coupled to said power supply lines; and
   said constant current source providing a constant current to said first zener diode through said first resistor for biasing said first zener diode to function as a stable DC voltage regulator providing a regulated voltage.

8. The circuit of claim 7 wherein said means for providing a constant DC voltage to said power supply lines further includes:
   said noninverting input terminal of said high gain op-amp operatively coupled to an intersection of said first resistor and said first zener diode whereby said regulated voltage is applied to said noninverting input terminal of said high gain op-amp; and
   means integrally formed within said high gain op-amp for applying said regulated voltage to said inverting input terminal of said high gain op-amp.

9. The circuit of claim 8 wherein said means for providing a constant DC voltage to said power supply lines further includes:
   a second branch including two serially connected resistors;
   said second branch operatively coupled to said power supply lines; and
   a fourth resistor having a first end connected to said inverting input of said high gain op-amp, and a second end connected to an intersection of said two serially connected resistors of said second branch.

10. The circuit of claim 9 wherein said means for providing a constant DC voltage to said power supply lines further includes:
    means for substantially preventing DC current flow through said fourth resistor, thereby allowing said regulated voltage at said inverting input of said high gain op-amp and said first end of said fourth resistor to appear at said second end of said fourth resistor and across one of said two serially connected resistors.

11. The circuit of claim 10 wherein said regulated voltage across said one of said two serially connected resistors draws a constant current through said second branch thereby providing said constant DC voltage to said power supply lines.

12. The circuit of claim 11, further including an active integrating amplifier interposed between and operatively coupled to said sensor and said high gain op-amp wherein said active integrating amplifier integrates said acceleration signal and outputs said voltage velocity signal which is coupled to said high gain op-amp.

13. The circuit of claim 12 wherein said active integrating amplifier includes a second op-amp having a noninverting input operatively coupled to a first terminal of said sensor and an inverting input operatively coupled to a second terminal of said sensor through a resistance.

14. The circuit of claim 13 wherein said second op-amp further includes an output terminal connected to said inverting input terminal of said high gain op-amp through a capacitance and adjustable resistance.

15. The circuit of claim 14 wherein said second op-amp further includes a feedback loop including a capacitance coupled between said inverting input and said output of said second op-amp.

16. The circuit of claim 15 wherein said second op-amp further includes power supply terminals operatively coupled to said power supply terminals of said high gain op-amp.

17. The circuit of claim 16 wherein said power supply terminals of said second op-amp and said high gain op-amp are operatively coupled to said power supply lines whereby said constant DC voltage across said power supply lines provides a stable DC bias voltage for said second op-amp and said high gain op-amp; and
    power supply rejection means integrally formed within said second op-amp and said high gain op-amp;
    whereby said output signal voltage from said transistor rides on top of said constant DC voltage across said power supply lines.

* * * * *